United States Patent
Nakamura et al.

(10) Patent No.: US 10,825,760 B2
(45) Date of Patent: Nov. 3, 2020

(54) SEMICONDUCTOR CHIP AND SEMICONDUCTOR DEVICE PROVIDED WITH SAME

(71) Applicant: SOCIONEXT INC., Kanagawa (JP)

(72) Inventors: Toshihiro Nakamura, Yokohama (JP); Isao Motegi, Yokohama (JP); Noriyuki Shimazu, Yokohama (JP); Masanobu Hirose, Yokohama (JP); Taro Fukunaga, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 42 days.

(21) Appl. No.: 16/165,486

(22) Filed: Oct. 19, 2018

(65) Prior Publication Data

US 2019/0051588 A1 Feb. 14, 2019

Related U.S. Application Data

(63) Continuation of application No. PCT/JP2017/009440, filed on Mar. 9, 2017.

(30) Foreign Application Priority Data

Apr. 22, 2016 (JP) .................................. 2016-086125

(51) Int. Cl.
*H01L 23/498* (2006.01)
*H01L 23/00* (2006.01)

(52) U.S. Cl.
CPC ........ *H01L 23/49811* (2013.01); *H01L 24/06* (2013.01); *H01L 24/49* (2013.01);
(Continued)

(58) Field of Classification Search
CPC ............. H01L 24/49; H01L 2224/4911; H01L 2224/49111; H01L 2224/49113;
(Continued)

(56) References Cited

U.S. PATENT DOCUMENTS

| | | | |
|---|---|---|---|
| 6,770,982 B1* | 8/2004 | Liou | H01L 23/645 257/690 |
| 7,091,791 B1* | 8/2006 | Terrovitis | H03F 3/04 330/301 |
| 2005/0162880 A1 | 7/2005 | Miyaki et al. | |
| 2006/0017159 A1* | 1/2006 | Kamata | H01L 24/03 257/737 |
| 2009/0242268 A1 | 10/2009 | Fukuda | |

FOREIGN PATENT DOCUMENTS

| | | |
|---|---|---|
| JP | 2005-191447 A | 7/2005 |
| JP | 2006-339439 A | 12/2006 |
| JP | 2009-246086 A | 10/2009 |

OTHER PUBLICATIONS

English translation of International Search Report issued in Application No. PCT/JP2017/009440 dated Jun. 6, 2017.
(Continued)

*Primary Examiner* — David A Zarneke
(74) *Attorney, Agent, or Firm* — McDermott Will & Emery LLP

(57) ABSTRACT

A semiconductor chip having a core region and an I/O region which surrounds the core region is provided with a plurality of external connection pads connected to I/O cells. The plurality of external connection pads include a first pad group comprised of the external connection pads connected to the same node, and a second pad group comprised of the external connection pads connected to respective different nodes. In first and second pad groups, the external connection pads are arranged in an X direction along an external side of the semiconductor chip, and a pad arrangement pitch in the first pad group is smaller than that in the second pad group.

14 Claims, 8 Drawing Sheets

(52) U.S. Cl.
CPC .... *H01L 24/48* (2013.01); *H01L 2224/04042* (2013.01); *H01L 2224/05548* (2013.01); *H01L 2224/05554* (2013.01); *H01L 2224/06* (2013.01); *H01L 2224/0603* (2013.01); *H01L 2224/06132* (2013.01); *H01L 2224/06133* (2013.01); *H01L 2224/06135* (2013.01); *H01L 2224/06177* (2013.01); *H01L 2224/48091* (2013.01); *H01L 2224/48106* (2013.01); *H01L 2224/48108* (2013.01); *H01L 2224/48227* (2013.01); *H01L 2224/4917* (2013.01); *H01L 2224/49113* (2013.01); *H01L 2224/49175* (2013.01); *H01L 2224/49177* (2013.01); *H01L 2924/00014* (2013.01); *H01L 2924/15311* (2013.01)

(58) Field of Classification Search
CPC ... H01L 2224/4912; H01L 2224/49431; H01L 2224/48476; H01L 2224/4013
See application file for complete search history.

(56) References Cited

OTHER PUBLICATIONS

Written Opinion issued in International Application No. PCT/JP2017/009400 dated Jun. 6, 2017, with English translation.

\* cited by examiner

SEMICONDUCTOR CHIP AND SEMICONDUCTOR DEVICE PROVIDED WITH SAME

CROSS-REFERENCE TO RELATED APPLICATION

This is a continuation of International Application No. PCT/JP2017/009440 filed on Mar. 9, 2017, which claims priority to Japanese Patent Application No. 2016-086125 filed on Apr. 22, 2016. The entire disclosures of these applications are incorporated by reference herein.

BACKGROUND

The present disclosure relates to a semiconductor chip including a core region and an input/output (I/O) region.

In recent years, semiconductor integrated circuits have further increased in scale to have an increasing number of input and output signals. Therefore, a device including such a semiconductor integrated circuit, namely, a semiconductor chip is provided with a significantly increasing number of external connection pads configured to transmit and receive, for example, signals to or from the outside of the device. The increase in the number of the external connection pads leads to an increase in area of the semiconductor chip. In addition, it is difficult to miniaturize such external connection pads due to a concern of a short-circuiting during a fabrication process or due to an Electrostatic discharge (ESD) standard.

Japanese Unexamined Patent Publication No. 2005-191447 discloses a semiconductor device in which a width of each of power supply-line pads is set wider than that of other pads and a diameter of each of the wires is set greater than that of other wires. This configuration allows for increasing the connection strength between the power supply-line pads and the wires.

SUMMARY

However, the configuration in Japanese Unexamined Patent Publication No. 2005-191447 cannot achieve more integrated pads, and thus, a necessary number of power supply-line pads is needed to secure operating characteristics. This results in an increase of area of the semiconductor device, which poses a problem.

The present disclosure attempts to provide a technique of, without causing degradation of operating characteristics of a semiconductor integrated circuit, efficiently arranging external connection pads to reduce the area of a semiconductor chip.

In one aspect of the present disclosure, a semiconductor chip that has a core region in which an internal circuit is formed, and an I/O region which surrounds the core region, the semiconductor chip including: a plurality of I/O cells disposed in the I/O region; and a plurality of external connection pads each connected to one or more of the plurality of I/O cells, wherein the plurality of external connection pads include: a first pad group comprised of the external connection pads connected to a same node; and a second pad group comprised of the external connection pads connected to respective different nodes, in each of the first and second pad groups, the external connection pads are arranged in a first direction along an external side of the semiconductor chip, a pad arrangement pitch in the first pad group is smaller than a pad arrangement pitch in the second pad group, and the external connection pads belonging to the first pad group are connected together through an interconnect.

According to this aspect, the semiconductor chip includes the plurality of external connection pads each connected to one or more of the plurality of I/O cells. The plurality of external connection pads include a first pad group connected to the same node, and a second pad group connected to respective different nodes. The first and second pad groups are disposed in the first direction in which the plurality of external connection pads are arranged along an external side of the semiconductor chip. The pad arrangement pitch in the external connection pads in the first pad group is smaller than that in the second pad group. In the first pad group, the external connection pads and the bonding wires connected to the external connection pads are probably brought in contact with, and short-circuited to, each other. However, the pads and the bonding wires in the first pad group are connected to the same node, and thus, even such short-circuiting causes no problem. Therefore, the external connection pads can be arranged more densely without causing degradation of operating characteristics of the circuit. This can reduce the area where the pads are arranged, and thus, reduce the area of the semiconductor chip.

In another aspect of the present disclosure, a semiconductor chip that has a core region in which an internal circuit is formed, and an I/O region which surrounds the core region, the semiconductor chip comprising: a plurality of I/O cells disposed in the I/O region; and a plurality of external connection pads each connected to one or more of the plurality of I/O cells, wherein the plurality of external connection pads include: a first pad group comprised of the external connection pads connected to a same node; and a second pad group comprised of the external connection pads connected to respective different nodes, in each of the first and second pad groups, a plurality of pad rows each comprised of the external connection pads arranged in a first direction along an external side of the semiconductor chip are arranged in a second direction perpendicular to the first direction, and in at least one of the first direction or the second direction, a pad arrangement pitch in the first pad group is smaller than a pad arrangement pitch in the second pad group.

According to this aspect, the semiconductor chip includes the plurality of external connection pads each connected to one or more of the plurality of I/O cells. The plurality of external connection pads include a first pad group connected to the same node, and a second pad group connected to respective different nodes. Each of the first and second pad groups is disposed such that the plurality of pad rows each comprised of the external connection pads arranged in the first direction along an external side of the semiconductor chip are arranged in the second direction perpendicular to the first direction. In at least one of the first direction or the second direction, the pad arrangement pitch in the first pad group is smaller than that in the second pad group. In the first pad group, the external connection pads and the bonding wires connected to the external connection pads are probably brought in contact with, and short-circuited to, each other. However, the pads and the bonding wires in the first pad group are connected to the same node, and thus, even such short-circuiting causes no problem. Therefore, the external connection pads can be arranged more densely without causing degradation of operating characteristics of the circuit. This can reduce the area where the pads are arranged, and thus, reduce the area of the semiconductor chip.

In yet another aspect of the present disclosure, a semiconductor device comprising: the above described semiconductor chip; a package substrate having a main surface on which the semiconductor chip is mounted; and a plurality of fingers arranged on the main surface of the package substrate in a vicinity of the semiconductor chip, wherein the plurality of fingers include: a first finger comprised of at least one finger connected to the external connection pads belonging to the first pad group; and a second finger comprised of a plurality of fingers each of which corresponds to, and is connected to, an associated one of the external connection pads belonging to the second pad group.

The present disclosure allows for, without causing degradation of operating characteristics of a semiconductor integrated circuit, efficiently arranging external connection pads to reduce the area of a semiconductor chip.

DETAILED DESCRIPTION

First Embodiment

Figure 1:
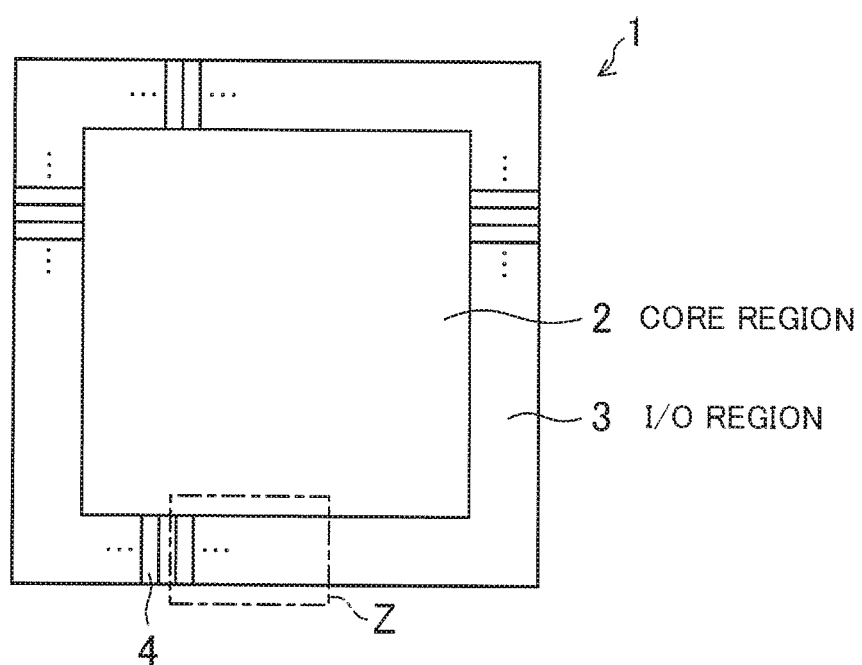
FIG. 1 is a plan view schematically illustrating an overall configuration for a semiconductor chip according to embodiments.

FIG. 1 is a plan view schematically illustrating an overall configuration for a semiconductor chip 1 according to embodiments. The semiconductor chip 1 illustrated in FIG. 1 includes a core region 2 in which an internal circuit is formed, and an I/O region 3 which surrounds the core region 2 and in which an interface circuit (i.e., an I/O circuit) is formed. Although not illustrated in detail in FIG. 1, the I/O region 3 includes a plurality of I/O cells 4 constituting the I/O circuit such that the plurality of I/O cells 4 encircle the entire periphery of the semiconductor chip 1. Although not illustrated in FIG. 1, the semiconductor chip 1 further includes a plurality of external connection pads (hereinafter simply referred to as "pads," as appropriate) arranged therein. The external connection pads are arranged in the I/O region 3 and a part of the core region 2, and each of the pads is connected to any of the plurality of I/O cells 4.

Figure 2:
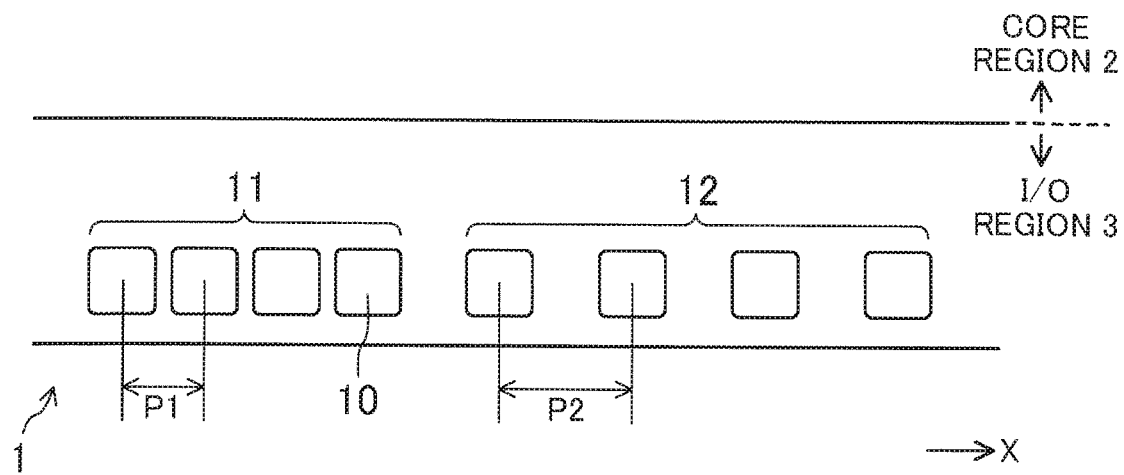
FIG. 2 illustrates an exemplary arrangement of pads in a semiconductor chip according to a first embodiment.

FIG. 2 illustrates an exemplary arrangement of pads in the semiconductor chip 1 according to the first embodiment. Although FIG. 2 corresponds to an enlarged view of the portion Z in FIG. 1, the I/O cells 4 are omitted (the same is applied to the other drawings). In FIG. 2, in the I/O region 3, a plurality of external connection pads 10 are arranged in an X direction corresponding to a first direction (the horizontal direction in the drawing, i.e., a direction along an external side of the semiconductor chip 1). Each of the external connection pads 10 is connected the outside of the semiconductor chip 1.

Figure 3:
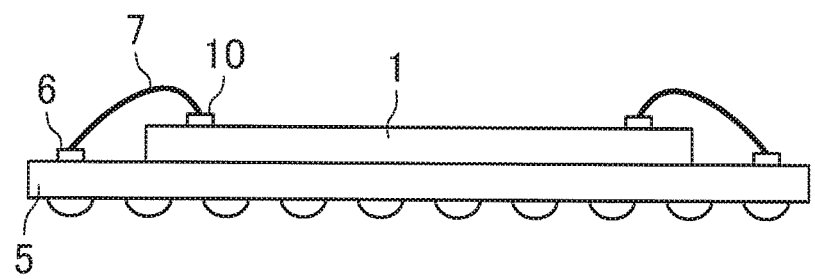
FIG. 3 is a cross-sectional view illustrating an exemplary configuration of a semiconductor device on which the semiconductor chip is mounted.

FIG. 3 is a cross-sectional view illustrating an exemplary configuration of a semiconductor device on which the semiconductor chip 1 is mounted. The configuration in FIG. 3 is an example of a Ball Grid Array (WA) package. The semiconductor chip 1 is mounted on the main surface of the package substrate 5. Bonding fingers 6 are arranged on the main surface of the package substrate 5 in the vicinity of the semiconductor chip 1. The pads 10 of the semiconductor chip are connected to the fingers 6 provided on the package substrate 5 through bonding wires 7.

Referring back to FIG. 2, the plurality of pads 10 include a first pad group 11 and a second pad group 12. Here, the first and second pad groups 11 and 12 are disposed adjacent to each other along the same side of the semiconductor chip 1 with no other pad interposed therebetween.

The first pad group 11 is comprised of four pads 10 connected to the same node. In the present disclosure, "the pads connected to the same node" means pads supplying the circuit in the semiconductor chip 1 with the same potential or the same signal. Examples of "the pads connected to a node" include power supply pads supplying the same power supply potential, ground pads supplying a ground potential, signal pads receiving a common signal, signal pads outputting a common signal, and signal pads supplying the same bias potential. Here, the pads 10 belonging to the first pad group 11 are all supposed to supply the same power supply potential VDD.

In contrast, the second pad group 12 is comprised of four pads 10 connected to respective different nodes. That is to say, the pads 10 belonging to the second pad group 12 have different roles, and for example, the pads 10 may be signal pads receiving different signals, or may be power supply pads supplying different power supply potentials.

The pads 10 belonging to the first pad group 11 are arranged in the X direction at an equal pitch P1, and the pads 10 belonging to the second pad group 12 are arranged in the X direction at an equal pitch P2. The arrangement pitch P1 in the first pad group 11 is smaller than the arrangement pitch P2 in the second pad group 12.

The arrangement of the pads in FIG. 2 can reduce intervals between the pads 10 in the first pad group 11 in the X direction to arrange the pads 10, more densely. In the first pad group 11, the pads 10 and the bonding wires 7 connected to the pads 10 are probably brought in contact with, and short-circuited to, each other. However, the pads 10 in the first pad group 11 are connected to the same node, and thus, even such short-circuiting causes no problem. Therefore, the pads 10 can be arranged more densely without causing degradation of operating characteristics of the circuit. This can reduce the area where the pads are arranged, and thus, reduce the area of the semiconductor chip.

Figure 4:
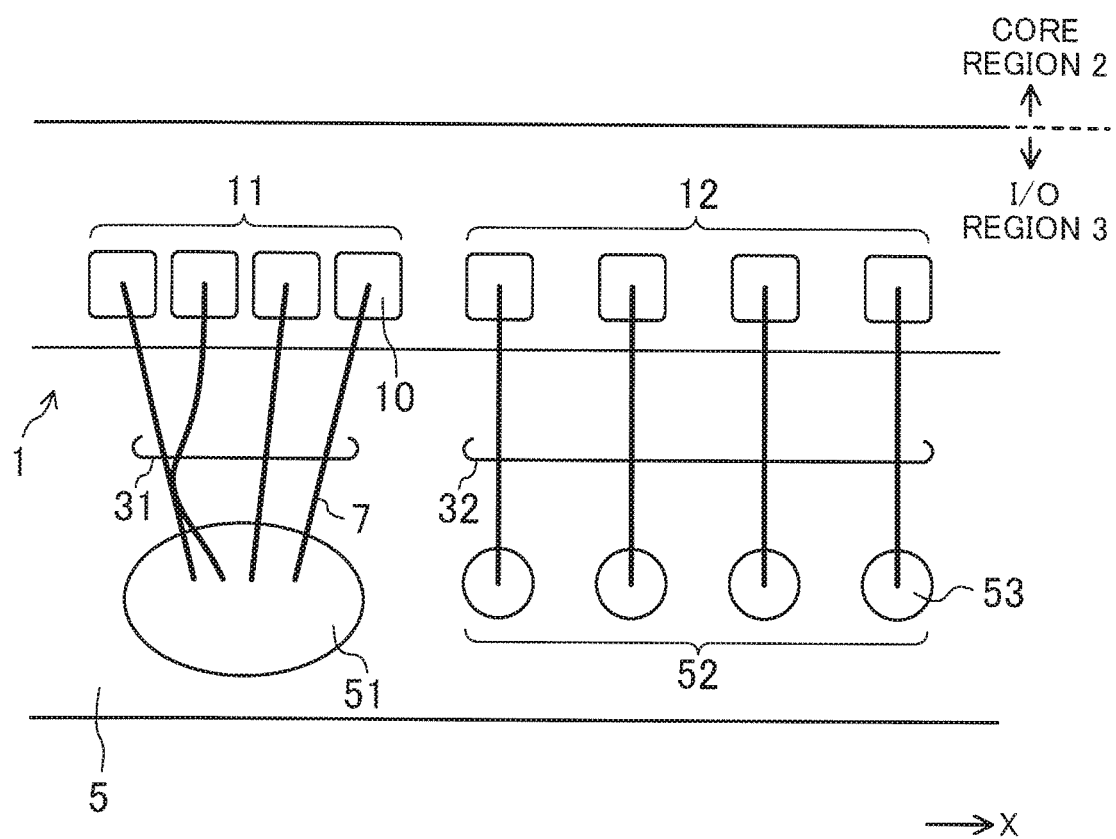
FIG. 4 illustrates an exemplary configuration in which the pads shown in FIG. 2 are connected to a package substrate.

FIG. 4 illustrates an exemplary configuration in which the pads shown in FIG. 2 are connected to the package substrate. In FIG. 4, a single first finger 1 and a second finger 52 are arranged on the main surface of the package substrate 5 in the vicinity of the semiconductor chip 1. The single first finger 51 is connected to the pads 10 belonging to the first pad group 11. The second finger 52 is comprised of a plurality of fingers 53 associated with the respective pads 10 belonging to the second pad group 12. Several bonding wires 7 belong to a first wire group 31, and connect the pads 10 belonging to the first pad group 11 to the first finger 51. Several other bonding wires 7 belong to a second wire group 32, and each of the boding wires 7 connects an associated one of the pads 10 belonging to the second pad group 12 to an associated one of the fingers 53.

Here, at least some of the bonding wires 7 belonging to the first wire group 31 may be in contact with each other. The pads 10 belonging to the first pad group 11 are connected to the same node. Thus, even if the bonding wires 7 belonging to the first wire group 31 are short-circuited to each other, no problem occurs. Rather, short-circuiting the bonding wires 7 belonging to the first wire group 31 to each other can obtain advantages that, e.g., an inductance is reduced to improve I/O operating characteristics, and the power supply passage is strengthened to improve operating characteristics.

The first finger 51 is a single finger. Alternatively, the first finger 51 may be comprised of a plurality fingers. For example, the first finger 51 may be comprised of two fingers, and each two of the pads 10 belonging to the first pad group 11 may be connected to an associated one of the fingers.

Figure 5:
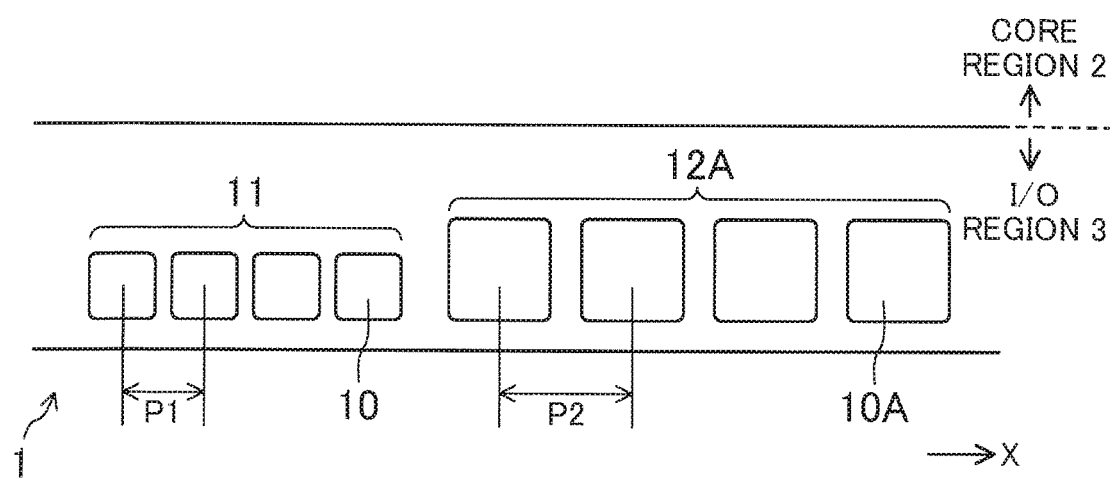
FIG. 5 illustrates another exemplary arrangement of pads in the first embodiment.

FIG. 5 illustrates another exemplary arrangement of pads in this embodiment. The configuration in FIG. 5 is the same as or similar to that in FIG. 2, basically, except that pads 10A belonging to a second pad group 12A have a larger size than the pads 10 belonging to the first pad group 11.

Figure 6:
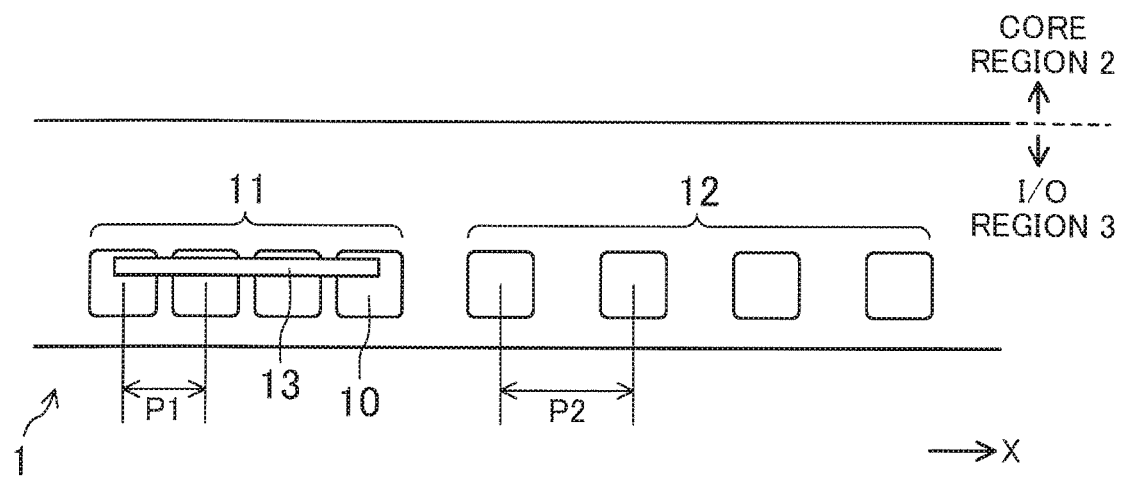
FIG. 6 illustrates yet another exemplary arrangement of pads in the first embodiment.

FIG. 6 illustrates yet another exemplary arrangement of pads in this embodiment. The configuration in FIG. 6 is the same as or similar to that in FIG. 2, basically, except that the pads 10 belonging to the first pad group 11 are connected together through an interconnect 13. This can also obtain advantages that, e.g., an inductance is reduced to improve I/O operating characteristics, and the power supply passage is strengthened to improve operating characteristics, just like in the case where the bonding wires 7 belonging to the first wire group 31 are short-circuited to each other. An interconnect layer constituting h interconnect 13 may be integrally formed with the pads 10 or separately formed from the pads 10.

In the embodiment described above, the number of the pads 10 in each the first and second pad groups 11 and 12 is four. However, this is only an exemplary embodiment of the present disclosure. The number of the pads 10 in the first pad group 11 may be different from that of the pads 10 in the second pad group 12. Here, the first and second pad groups 11 and 12 are disposed adjacent to each other along the same side of the semiconductor chip 1. However, this is only an exemplary embodiment of the present disclosure. For example, at a position near a corner of the semiconductor chip 1, the first and second pad group 11 and 12 may be disposed along different sides. Also, the pads 10 not belonging to the first and second pad groups 11 and 12 may be of course arranged in the semiconductor chip 1.

In the embodiment described above, the pads 10 in each of the first and second pad groups 11 and 12 are arranged at an equal pitch. However, the pads 10 do not have to be arranged at an equal pitch. If the pads 10 are not arranged at an equal pitch, the arrangement pitch in the first pad group 11 may be compared with that in the second pad group 12 using the minimum pitch in each of the first and second pad groups 11 and 12.

Second Embodiment

Figure 7:
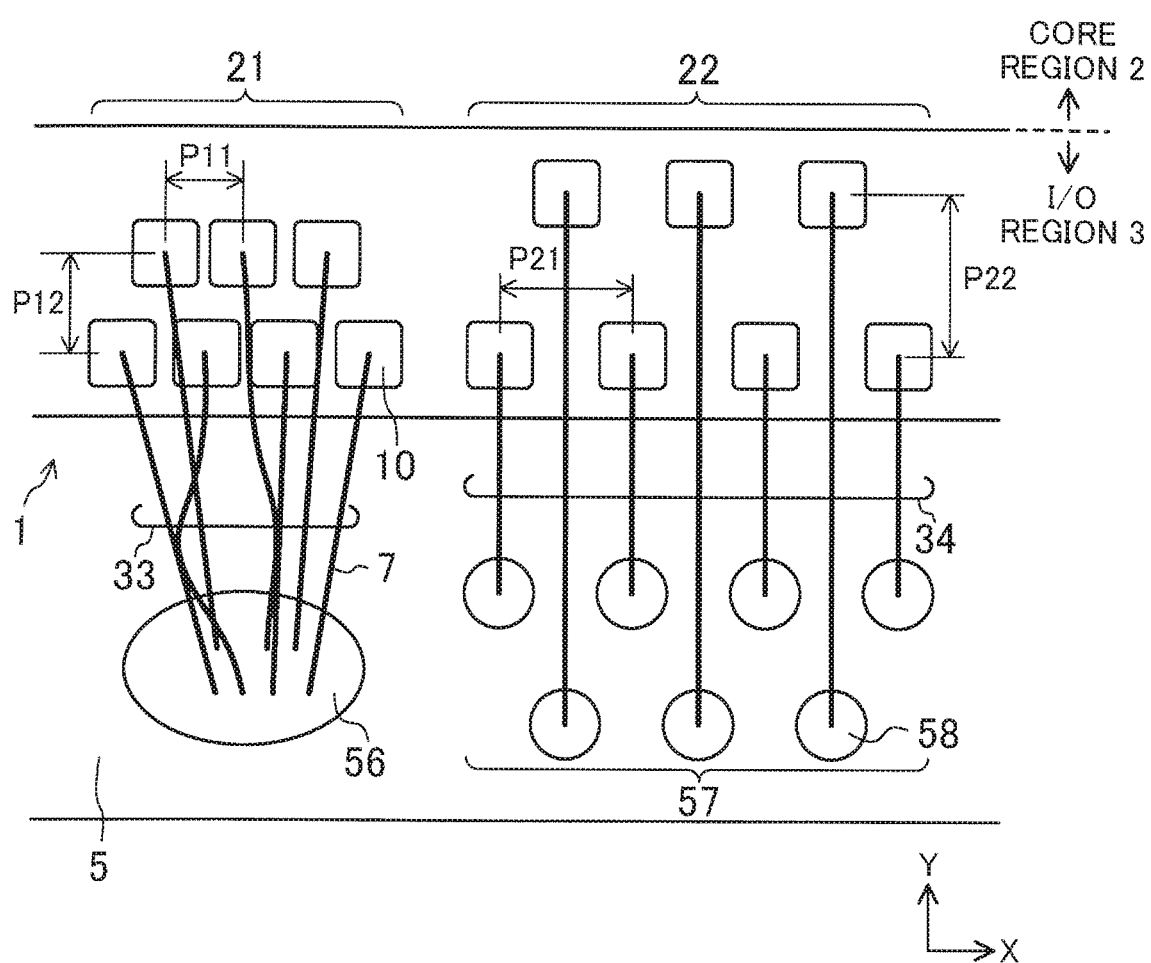
FIG. 7 illustrates an exemplary arrangement of pads in a semiconductor chip according to a second embodiment.

FIG. 7 illustrates an exemplary arrangement of pads in the semiconductor chip according to a second embodiment. FIG. 7 illustrates the exemplary configuration in which the pads 10 are connected to the package substrate 5. In FIG. 7, the plurality of external connection pads 10 are disposed in the I/O region 3 in multi-stage manner (two stages in FIG. 2). Each of the external connection pads 10 is connected the outside of the semiconductor chip 1.

The plurality of pads 10 include a first pad group 21 and a second pad group 22. Here, the first and second pad groups 21 and 22 are disposed adjacent to each other along the same side of the semiconductor chip 1 with no other pad interposed therebetween.

The first pad group 21 is comprised of seven pads 10 connected to the same node. Here, the pads 10 belonging to the first pad group 21 are all supposed to supply the same power supply potential VDD. In the first pad group 21, two pad rows each comprised of the pads 10 arranged in the X direction corresponding to the first direction (the horizontal direction in the drawing, i.e., the direction along an external side of the semiconductor chip 1) are arranged in a Y direction corresponding to a second direction and being perpendicular to the X direction (the vertical direction in the drawing).

In contrast, the second pad group 22 is comprised of seven pads 10 connected to respective different nodes. That is to say, the pads 10 belonging to the second pad group 22 have different roles, and for example, the pads 10 may be signal pads receiving different signals, or power supply pads supplying different power supply potentials. In the second pad group 22, two pad rows each comprised of the pads 10 arranged in the X direction are arranged in the Y direction.

In the first pad group 21, the pads 10 in each of the pad rows are arranged in the X direction at an equal pitch P11, and the pad rows are arranged in the Y-direction at an equal pitch P12. In the second pad group 22, the pads 10 in each of the pad rows are arranged in the X direction at an equal pitch P21, and the pad rows are arranged in the Y direction at an equal pitch P22. In the X direction, the arrangement pitch P11 in the first pad group 21 is smaller than the arrangement pitch P21 in the second pad group 22. In the Y direction, the arrangement pitch P12 in the first pad group 21 is smaller than the arrangement pitch P22 in the second pad group 22.

As illustrated in FIG. 7, a single first finger 56 and a second finger 57 are arranged on the main surface of the package substrate 5 in the vicinity of the semiconductor chip 1. The single first finger 56 is connected to the pads 10 belonging to the first pad group 21. The second finger 57 is comprised of a plurality of fingers 58 associated with the respective pads 10 belonging to the second pad group 22. Several bonding wires 7 belong to a first wire group 33, and connect the pads 10 belonging to the first pad group 21 to the first finger 56. Several other bonding wires 7 belong to a second wire group 34, and each of the boding wires 7 connects an associated one of the pads 10 belonging to the second pad group 22 to an associated one of the fingers 58.

The arrangement of the pads in FIG. 7 can reduce intervals between the pads 10 in the first pad group 21 in the X and Y directions to arrange the pads 10, more densely. In the first pad group 21, the pads 10 and the bonding wires 7 connected to the pads 10 are probably brought in contact with, and short-circuited to, each other. However, the pads 10 in the first pad group 21 are connected to the same node, and thus, even such short-circuiting causes no problem, Therefore, the pads 10 can be arranged more densely without causing degradation of operating characteristics of the circuit. This can reduce the area where the pads are arranged, and thus, reduce the area of the semiconductor chip.

Here, at least some of the bonding wires 7 belonging to the first wire group 33 may be in contact with each other. In this case, the bonding wires 7 to be connected to the pads 10 in the same pad row may be brought in contact with each other, and the bonding wires 7 connected to the pads 10 in the different pad rows may be brought in contact with each other. In any case, the pads 10 belonging to the first pad group 21 are connected to the same node. Thus, no problem occurs. Rather, short-circuiting the bonding wires 7 belonging to the first wire group 33 to each other can obtain advantages that, e.g., an inductance is reduced to improve I/O operating characteristics, and the power supply passage is strengthened to improve operating characteristics.

The first finger 56 is a single finger. Alternatively, the first finger 56 may be comprised of a plurality fingers. For example, the first finger 56 may be comprised of two fingers, and the pads 10 in each of the pad rows belonging to the first pad group 21 may be connected to an associated one of the fingers.

Figure 8:
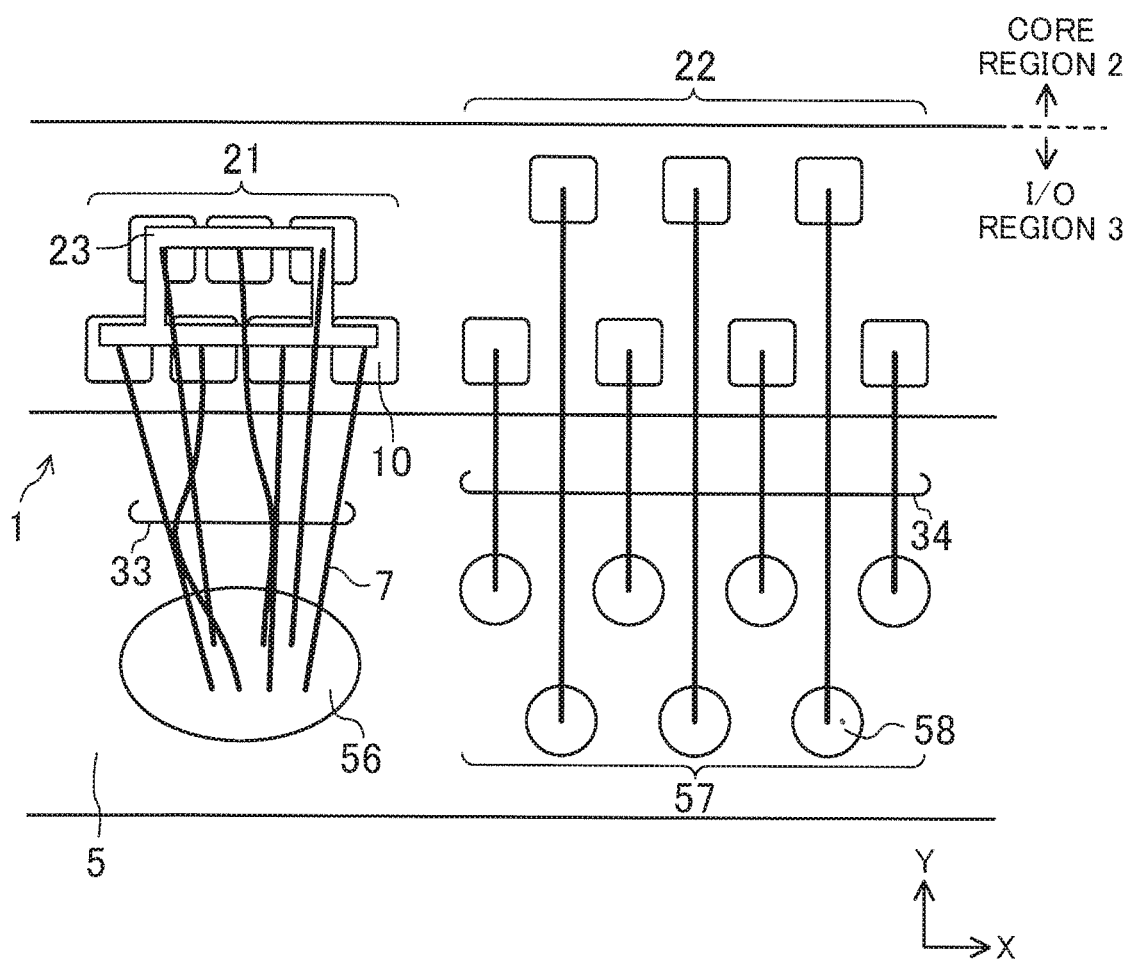
FIG. 8 illustrates another exemplary arrangement of pads in the second embodiment.

FIG. 8 illustrates another exemplary arrangement of pads in this embodiment. The configuration in FIG. 8 is the same as or similar to that in FIG. 7, basically, except that the pads 10 belonging to the first pad group 21 are connected together through an interconnect 23. This can also obtain advantages that, e.g., an inductance is reduced to improve I/O operating characteristics, and the power supply passage is strengthened to improve operating characteristics, just like in the case where the bonding wires 7 belonging to the first wire group 33 are short-circuited to each other. An interconnect layer constituting the interconnect 23 may be integrally formed with the pads 10 or separately formed from the pads 10.

Figure 9:
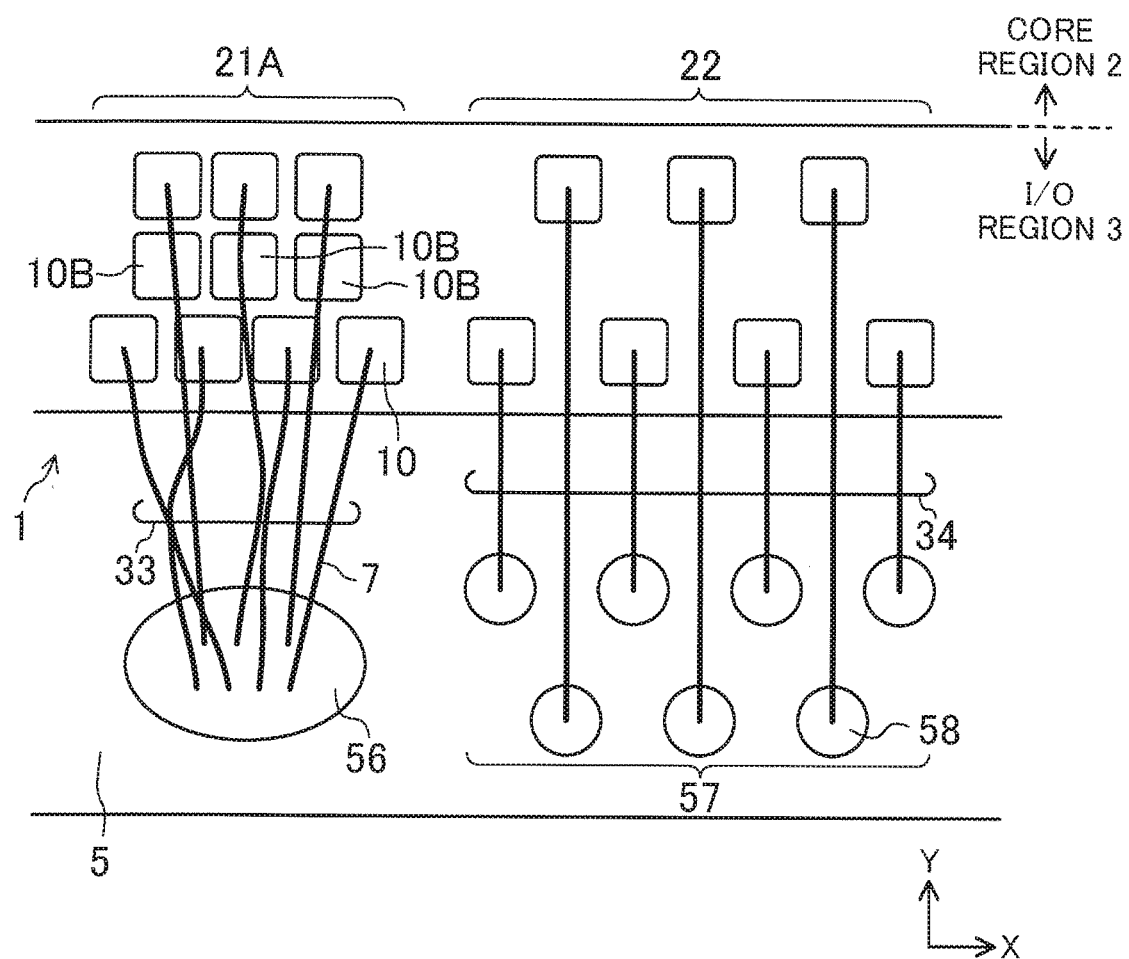
FIG. 9 illustrates yet another example of arrangement of pads in the second embodiment.

FIG. 9 illustrates yet another exemplary arrangement of pads in this embodiment. The configuration in FIG. 9 is the same as or similar to that in FIG. 7, basically, except that a first pad group 21A includes dummy pads 10B that are configured as external connection pads not connected to the bonding wires 7 and not connected to a plurality of fingers 6 arranged on the main surface of the package substrate 5 in the vicinity of the semiconductor chip 1. In the example of FIG. 9, the second pad row counted from the external side of the semiconductor chip 1 is comprised of three dummy pads 10B. Since the dummy pads 10B is provided, even if some problem occurs at formation of the bonding wires, such problems can be eliminated by changing the connection destination of the wires from the pads 10 to the dummy pads 10B. Also, since the dummy pads 10B are provided, a dead space in the region where the pads are arranged can be effectively utilized. The position and the number of the dummy pads 10B arranged are not limited to the position and the number shown in FIG. 9.

Here, in both the X direction and the Y direction, the arrangement pitch in the first pad group 21 is smaller than the arrangement pitch in the second pad group 22. However, this is only an exemplary embodiment of the present disclosure. That is to say, even if, in one of the X direction or the Y direction, the arrangement pitch in the first pad group 21 is smaller than the arrangement pitch in the second pad group 22, the same or similar advantage to the embodiment can be achieved.

In the embodiment described above, the number of the pads 10 in each the first and second pad groups 21 and 22 is seven. However, this is only an exemplary embodiment of the present disclosure. The number of the pads 10 in the first pad group 21 may be different from that of the pads 10 in the second pad group 22. Here, the first and second pad groups 21 and 22 are disposed adjacent to each other along the same side of the semiconductor chip 1. However, this is only an exemplary embodiment of the present disclosure. For example, at a position near a corner of the semiconductor chip 1, the first and second pad group 21 and 22 may be disposed along different sides. Also, the pads 10 not belonging to the first and second pad groups 21 and 22 may be of course arranged in the semiconductor chip 1.

In the embodiment described above, the pads 10 in each of the first and second pad groups 21 and 22 are arranged at an equal pitch. However, the pads 10 do not have to be arranged at an equal pitch. If the pads 10 are not arranged at an equal pitch, the arrangement pitch in the first pad group 21 may be compared with that in the second pad group 22 using the minimum pitch in each of the first and second pad groups 21 and 22 with respect to the X and Y directions.

As in the first embodiment, the pads belonging to the second pad group 22 may have a larger size than the pads 10 belonging to the first pad group 21.

The present disclosure allows for, without causing degradation of operating characteristics of a semiconductor integrated circuit, efficiently arranging external connection pads to reduce the area of the semiconductor chip. Thus, the present disclosure is effective for, e.g., downsizing a large scale integrated circuit and reducing costs.

What is claimed is:

1. A semiconductor chip that has a core region in which an internal circuit is formed, and an I/O region which surrounds the core region, the semiconductor chip comprising:
    a plurality of I/O cells disposed in the I/O region; and
    a plurality of external connection pads each connected to one or more of the plurality of I/O cells, wherein
    the plurality of external connection pads include:
        a first pad group comprised of the external connection pads connected to a same node; and
        a second pad group comprised of the external connection pads connected to respective different nodes,
    in each of the first and second pad groups, the external connection pads are arranged in a first direction along an external side of the semiconductor chip,
    a pad arrangement pitch in the first pad group is smaller than a pad arrangement pitch in the second pad group, and
    the external connection pads belonging to the first pad group are connected together through an interconnect.

2. The semiconductor chip of claim 1, wherein the first and second pad groups are disposed along a same side of the semiconductor chip.

3. The semiconductor chip of claim 1, wherein the first and second pad groups are disposed adjacent to each other with no other pad interposed therebetween.

4. The semiconductor chip of claim 1, wherein the external connection pads belonging to the second pad group have a larger size than the external connection pads belonging to the first pad group.

5. A semiconductor device comprising:
    the semiconductor chip of claim 1;
    a package substrate having a main surface on which the semiconductor chip is mounted; and
    a plurality of fingers arranged on the main surface of the package substrate in a vicinity of the semiconductor chip, wherein
    the plurality of fingers include:
        a first finger comprised of at least one finger connected to the external connection pads belonging to the first pad group; and
        a second finger comprised of a plurality of fingers each of which corresponds to, and is connected to, an associated one of the external connection pads belonging to the second pad group.

6. The semiconductor device of claim 5, further comprising
a plurality of bonding wires connecting the external connection pads belonging to the first pad group to the first finger, wherein
at least some of the plurality of bonding wires are in contact with each other.

7. A semiconductor chip that has a core region in which an internal circuit is formed, and an I/O region which surrounds the core region, the semiconductor chip comprising:
a plurality of I/O cells disposed in the I/O region; and
a plurality of external connection pads each connected to one or more of the plurality of I/O cells, wherein
the plurality of external connection pads include:
a first pad group comprised of the external connection pads connected to a same node; and
a second pad group comprised of the external connection pads connected to respective different nodes,
in each of the first and second pad groups, a plurality of pad rows each comprised of the external connection pads arranged in a first direction along an external side of the semiconductor chip are arranged in a second direction perpendicular to the first direction,
in at least one of the first direction or the second direction, a pad arrangement pitch in the first pad group is smaller than a pad arrangement pitch in the second pad group, and
the external connection pads belonging to the first pad group are connected together through an interconnect.

8. The semiconductor chip of claim 7, wherein in both the first and second directions, the pad arrangement pitch in the first pad group is smaller than the pad arrangement pitch in the second pad group.

9. The semiconductor chip of claim 7, wherein the first and second pad groups are disposed along a same side of the semiconductor chip.

10. The semiconductor chip of claim 7, wherein the first and second pad groups are disposed adjacent to each other with no other pad interposed therebetween.

11. The semiconductor chip of claim 7, wherein the external connection pads belonging to the first pad group have a smaller size than the external connection pads belonging to the second pad group.

12. A semiconductor device comprising:
the semiconductor chip of claim 7;
a package substrate having a main surface on which the semiconductor chip is mounted; and
a plurality of fingers arranged on the main surface of the package substrate in a vicinity of the semiconductor chip, wherein
the plurality of fingers include:
a first finger comprised of at least one finger connected to the external connection pads belonging to the first pad group; and
a second finger comprised of a plurality of fingers each of which corresponds to, and is connected to, an associated one of the external connection pads belonging to the second pad group.

13. The semiconductor device of claim 12, further comprising
a plurality of bonding wires connecting the external connection pads belonging to the first pad group to the first finger, wherein
at least some of the plurality of bonding wires are in contact with each other.

14. The semiconductor device of claim 12, wherein
the first pad group includes at least one dummy pad that is an external connection pad not connected to any of the plurality of fingers.

* * * * *